United States Patent [19]

Zametzer et al.

[11] Patent Number: 5,230,090
[45] Date of Patent: Jul. 20, 1993

[54] TRANSMISSION-RECEPTION SEPARATING FILTER WITH A PIN DIODE

[75] Inventors: Klaus Zametzer, Forchheim; Markus Vester, Erlangen, both of Fed. Rep. of Germany

[73] Assignee: Siemens Aktiengesellschaft, Munich, Fed. Rep. of Germany

[21] Appl. No.: 692,691

[22] Filed: Apr. 29, 1991

[30] Foreign Application Priority Data

May 23, 1990 [DE] Fed. Rep. of Germany ....... 4016640

[51] Int. Cl.$^5$ ................................................ H04B 1/46
[52] U.S. Cl. ........................................ 455/80; 455/82; 455/83; 333/103; 333/132
[58] Field of Search ................. 455/78, 79, 80, 82, 455/83; 333/101, 103, 126, 129, 132; 307/259

[56] References Cited

U.S. PATENT DOCUMENTS

| | | | |
|---|---|---|---|
| 4,525,863 | 6/1985 | Stites | 455/83 |
| 4,673,831 | 6/1987 | Reppen | 333/103 |
| 4,764,726 | 8/1988 | Misic et al. | 455/82 |
| 5,060,293 | 10/1991 | Kok et al. | 333/103 |
| 5,103,195 | 4/1992 | Dunsmore | 333/103 |

FOREIGN PATENT DOCUMENTS

| | | | |
|---|---|---|---|
| 2426506 | 12/1975 | Fed. Rep. of Germany . | |
| 2636969C2 | 2/1978 | Fed. Rep. of Germany . | |
| 3203961A1 | 8/1983 | Fed. Rep. of Germany . | |
| 8605962 | 10/1987 | France | 455/83 |
| 0033936 | 2/1984 | Japan | 455/82 |

OTHER PUBLICATIONS

"Rundfunksender als Energiequelle" Ecke fur den Nachwuchs Nr. 3, Mar. 1971, p. 60.
"PIN–und Schottky–Dioden" Alfred H. Verlag, Heidelberg, 1976 pp. 121–122.

Primary Examiner—Reinhard J. Eisenzopf
Assistant Examiner—Andrew Faile
Attorney, Agent, or Firm—Hill, Steadman & Simpson

[57] ABSTRACT

Transmission-Reception Separating Filter with a PIN diode. A PIN diode is arranged in the transmission channel of the transmission-reception separating filter that has the transmission channel for forwarding a high-frequency current from a transmitter to an antenna. A rectifier is provided that generates a control current for the PIN diode from the high-frequency current flowing in the transmission channel. As a result, a separate power supply is not required for controlling the PIN diode in the transmission channel.

22 Claims, 1 Drawing Sheet

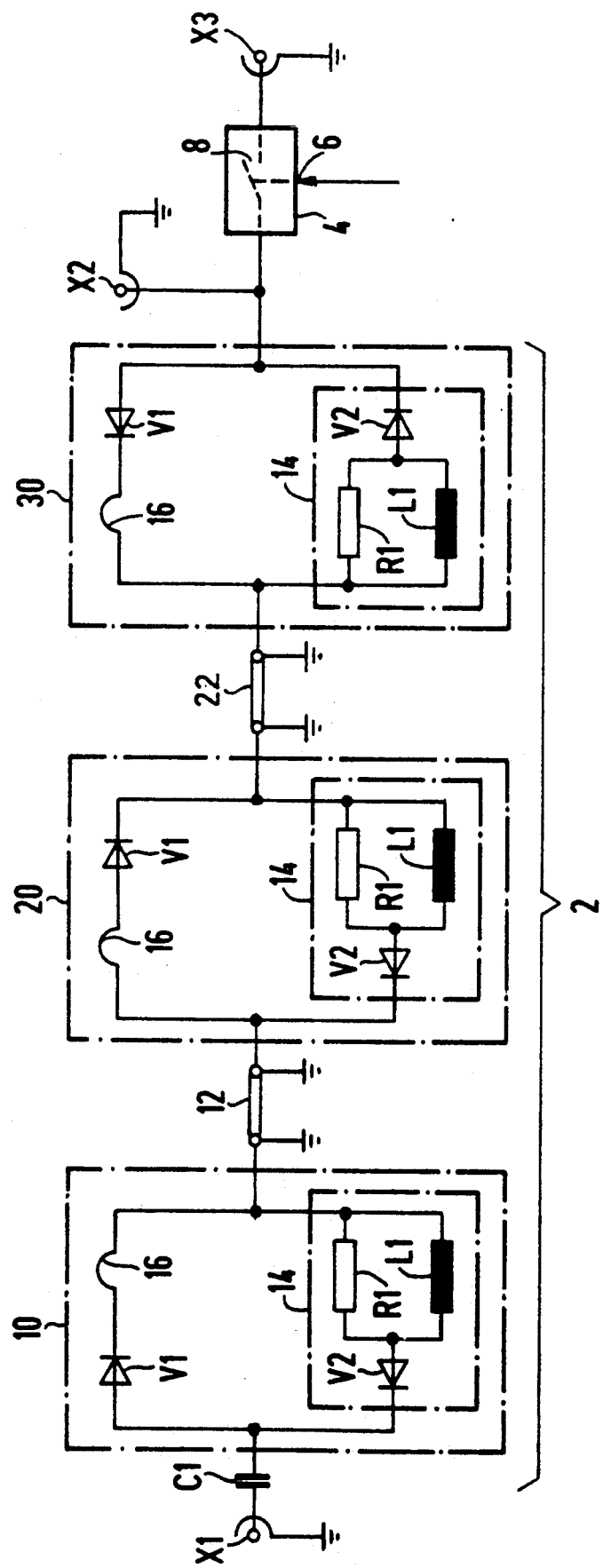

TRANSMISSION-RECEPTION SEPARATING FILTER WITH A PIN DIODE

BACKGROUND OF THE INVENTION

The present invention is directed to a transmission-reception separating filter having a transmission channel for forwarding a high-frequency current from a transmitter to an antenna, whereby a PIN diode is arranged in the transmission channel.

Transmission-reception separating filters are used to optionally connect a transmitter or a receiver to an antenna. A transmission-reception separating filter thus is an antenna switch and electrically corresponds to a mechanical switch. The use of PIN diodes in antenna switches or, respectively, transmission-reception separating filters is disclosed in the book by Erich Renz, "PIN und Schotty-Dioden", Heidelberg, 1976, pages 121 and 122. PIN diodes are well-suited as high-frequency switches because they have a low insertion attenuation in an "on" state and a high blocking attenuation in an "off" state In the Erich Renz reference, however, the control current for controlling the PIN diode in the transmission channel is supplied by an external voltage source. As a result the transmission-reception separating filter has a complex circuit configuration.

SUMMARY OF THE INVENTION

It is an object or the present invention to provide a transmission-reception separating filter that does not require a separate power supply for controlling the PIN diode in the transmission channel.

This object is inventively achieved in that a rectifier is provided that generates the control current for the PIN diode from the high-frequency current flowing in the transmission channel.

The present invention is based on the concept that, due to its long carrier life span, a PIN diode requires only a low control direct current for conduction. So that the charge stored by the PIN diode cannot be discharged by the negative half-wave of the high-frequency current, the following must apply:

$$Q_{PIN} = I_{DC}\tau_L > -\int_{\omega t = \pi}^{2\pi} \sqrt{2}\, I_{HFeff} \sin \omega t \, dt = (\sqrt{2}/\pi f) I_{HFeff}$$

where:
- $Q_{PIN}$ is the charge stored in the PIN diode;
- $I_{DC}$ is the control direct current of the PIN diode;
- $\tau_L$ is the life span of the charge carriers in the PIN diode; and
- $I_{HFeff}$ is the effective value of the high-frequency current.

Given, for example, a carrier life span and $\tau_L = 15$ μs and a high-frequency current $I_{HFeff} = 17$ A with a frequency of f = 64 MHz, the control direct current is then;

$$I_{DC} > I_{HFeff}/2120 = 8 \text{ mA}.$$

This low control direct current is inventively provided by the rectification of a small part of the high-frequency current that the transmitter forwards to the antenna via the transmission channel. Since the PIN diode is automatically made conductive with a control current in the transmission mode, no additional switches for switching the control current are required. The structure of the transmission channel is thus considerably simplified.

An advantageous development is characterized in that a capacitor is arranged in the transmission channel, and prevents the control current from flowing to the transmitter. It is thereby assured that the control current generated from the high-frequency current for the PIN diode flows completely into the PIN diode.

A further advantageous development is characterized in that the rectifier has a rectifier part having a rectifier diode connected in a reverse direction relative to the PIN diode. The control current for the PIN diode can be easily generated by a reverse connected switching diode.

In another advantageous development, an inductance is connected in series with the rectifier diode, whereby the series circuit of the rectifier diode and the inductance is connected in parallel to the PIN diode. This inductance protects the rectifier diode against excessively high high-frequency currents. The ratio of line inductance of the PIN diode to this inductance defines the magnitude of the control direct current. In another advantageous development, the inductance is bridged with an attenuating resistor for damping undesired oscillations.

For suppressing the disturbing noise of the transmitter in the reception mode, a plurality of PIN diodes are connected in series in the transmission channel in another advantageous development. These PIN diodes are connected to one another via short line sections whose capacitance at the highest operating frequency is significantly greater than the blocking capacitance of the PIN diodes. A rectifier is connected in a reverse direction relative to every PIN diode. Since the reception signals from the antenna are below the diode threshold, the PIN diodes are non-conductive and the transmitter is thus decoupled form the receiver. So that the line sections connected between the PIN diodes act as capacitors, they must be structured so that they are shorter in length than half the wavelength of the operating frequency.

In a preferred embodiment three PIN diodes are arranged in a cascade circuit in another advantageous development. This yields a suppression of the transmitter noise that is adequate in practice since the overall attenuation of the transmitter noise is now the product of the three individual attenuations of the cascade stages.

The transmission-reception separating filter is particularly suited for use in a medical nuclear magnetic resonance apparatus because, for frequencies in the megahertz range, it can forward high transmitter power in the kilowatt range to the antenna.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE is circuit diagram depicting the transmission channel of a transmission-reception separating filter having three PIN diodes.

DESCRIPTION OF THE PREFERRED EMBODIMENT

The transmission-reception separating filter shown in the single FIGURE is especially adapted for use in a medical nuclear magnetic resonance apparatus. It allows broad band transmission pulses having a frequency range from approximately 10 MHz through 90 MHz, i.e., a bandwidth of approximately 80 MHz, to be forwarded to an antenna given a pulse power of 15 KW. Even high bandwidths up to approximately 150 MHz are possible. The terminal for the transmitter is referenced X1, the terminal for the antenna is referenced X2 and the terminal for the receiver is referenced X3. A transmission channel 2 of the transmission reception separating filter is connected between the transmitter terminal X1 and the antenna terminal X2. A reception channel 4 of the transmission-reception separating filter is connected between the antenna terminal X2 and the receiver terminal X3. The reception channel 4 is controlled via a signal input 6 such that the receiver connected to the terminal X3 is decoupled in the transmission mode from the antenna that is connected to the terminal X2. This is illustrated in the single FIGURE by a switch 8 that is controlled by a signal on the signal input 6.

The transmission channel 2 has the function of decoupling the transmitter from the antenna in the reception mode so that the reception signal is not unnecessarily attenuated by the transmitter. In the preferred embodiment this is effected by three threshold circuits 10, 20, 30 connected in a cascade circuit, that is in series, and are connected to one another by short line sections 12, 22. The cascade circuit of the three threshold circuits 10, 20, 30 is connected, first, to the transmitter terminal X1 via a capacitor C1 and, second, to the antenna terminal X2 and to the reception channel 4.

The threshold circuits 10, 20, 30 are each composed of respective parallel circuits of a PIN diode V1 and a rectifier 14. The rectifier 14 supplies the control current for the PIN diode V1 so that it continues to remain conductive even in the negative half-wave of the high-frequency current. Due to the relatively long carrier life span in the PIN diode V1, only an extremely low control current of, for example, 0.2 A is required.

The rectifier 14 has a rectifier diode V2 that supplies the control current as a direct current. An inductor L1 is connected in series with the rectifier diode V2 for limiting the high-frequency current through the rectifier diode V2. The ratio of the inductor L1 to the line inductance of the PIN diode V1, the line inductance being illustrated by semicircle 16, thus determines the magnitude of the control direct current. A resistor R1 is connected in parallel to the inductor L1 for attenuating parasitic oscillations at the inductor L1.

The threshold circuit 30 connected to the antenna terminal X2 is connected oppositely to the other threshold circuits 10, 20. As a result the charge reversal of the capacitor C1 is not that great.

The function of the transmission-reception separating filter shall be set forth below. Upon transmission, high-frequency current flows mainly through the PIN diodes V1 in the threshold circuits 10, 20, 30. Due to their long carrier life span, the PIN diodes V1 only require a low control direct current for conduction. This is produced by rectifying a small part of the high-frequency current with the fast rectifier diode V2. The ratio of the control current to the high-frequency current is defined by the ratio of the line inductance 16 of the PIN diode V1 and the inductor L1 in the rectifier 14. The attenuating resistor R1 has a significantly greater resistance value than the reactance of the inductance L1.

The work division of the diodes V1 and V2 in the threshold circuits 10, 20, 30 is advantageous. Although the PIN diode V1 is slow, it is high-current compatible. Moreover, it has an extremely low on-state direct current resistance, and as a result the insertion attenuation is low. The diode V2, by contrast, is a fast switching diode that, however, need only carry a low current.

During reception, a low reception signal at the antenna terminal X2 does not make the threshold circuit 30 connection to the antenna terminal X2 conductive and all threshold circuits 10, 20 30 in the transmission channel 2 are thus inhibited. The cascade circuit of a plurality of threshold circuits is provided in order to practically completely suppress the noise of the transmitter in the reception mode. This is achieved in that it is essentially only the low diode blocking capacitance of the PIN diode V1 of, for example 3 pF and the diode V2 that are effective below the diode threshold voltage. The line sections 12, 22 arranged between the thresholds are then nearly in a no-load condition and each forms a capacitor to ground or, respectively, to the reference potential. For example, the capacitance to ground is 30 pF for, for example, a 50 ohm line that has an electrical length that is significantly shorter than the wavelength on the line. The overall attenuation of the transmitter noise is thus only the product of the attenuation of the individual cascade stages.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A transmission-reception separating filter having a transmission channel for forwarding a high-frequency current from a transmitter to an antenna, at least one PIN diode being i the transmission channel, comprising: at least one rectifier operationally connected to the at least one PIN diode that generates a control current for the at least one PIN diode from the high-frequency current flowing in the transmission channel; and the rectifier having a rectifier part having a rectifier diode that is connected in a reverse direction relative to the at least one PIN diode, the rectifier diode having a carrier life span that is significantly shorter than a carrier life span of the at least one PIN diode.

2. The transmission-reception separating filter according to claim 1, wherein the transmission channel has a capacitor, said capacitor preventing the control current from flowing to the transmitter.

3. The transmission-reception separating filter according to claim 1, wherein an inductor is connected in series with the rectifier diode, whereby the series circuit of the rectifier diode and the inductor is connected in parallel to the at least one PIN diode.

4. The transmission-reception separating filter according to claim 3, wherein the inductor is bridged with an attenuating resistor.

5. The transmission-reception separating filter according to claim 1, wherein a plurality of PIN diodes are connected in a cascade circuit in the transmission channel, the plurality of PIN diodes being connected to one another via short line sections, at least one of the short line sections having a capacitance at a highest operating frequency of the high-frequency current that is significantly greater than a blocking capacitance of the PIN diodes, and wherein a rectifier is connected across each PIN diode in a reverse direction relative to the respective PIN diode.

6. The transmission-reception separating filter according to claim 5, wherein the plurality of PIN diodes comprise three PIN diodes that are connected in series.

7. The transmission-reception separating filter according to claim 1, wherein said separating filter is connected in a medical nuclear magnetic resonance apparatus.

8. A transmission-reception separating filter for use with at least a transmitter and an antenna, comprising:
a transmission channel connected between the transmitter and the antenna for forwarding a high-frequency current from the transmitter to the antenna, the high-frequency current being provided by the transmitter;
at least one PIN diode in said transmission channel;
at least one rectifier means having at least a rectifier diode connected in parallel to said at least one PIN diode, the rectifier diode connected in a reverse direction relative to said at least one PIN diode for generating a control current for the at least one PIN diode from the high-frequency current flowing in the transmission channel;
wherein the control current is generated only when the transmitter provides the high-frequency current and therefore the at least one PIN diode only being conductive when the high-frequency current flows in the transmission channel.

9. The transmission-reception separating filter according to claim 8, wherein the transmission channel has at least one capacitor, said capacitor preventing the control current from flowing to the transmitter.

10. The transmission-reception separating filter according to claim 8, wherein the rectifier diode has a carrier life span that is significantly shorter than a carrier life span of the PIN diode.

11. The transmission-reception separating filter according to claim 10, wherein an inductor is connected in series with the rectifier diode, whereby the series circuit of the rectifier diode and the inductor is connected in parallel to the PIN diode.

12. The transmission-reception separating filter according to claim 11, wherein the inductor is bridged with an attenuating resistor.

13. The transmission-reception separating filter according to claim 8, wherein the transmission reception separating filter has a plurality of rectifiers and has a plurality of PIN diodes that are connected in a cascade circuit in the transmission channel, the plurality of PIN diodes being connected to on another via short line sections, at least one of the short line sections having a capacitance at a highest operating frequency of the high-frequency current that is significantly greater than a blocking capacitance of the PIN diodes, and wherein a respective rectifier is connected across a respective PIN diode in a reverse direction relative to the respective PIN diode.

14. The transmission-reception separating filter according to claim 13, wherein three PIN diodes are connected in series.

15. A transmission-reception separating filter for use with a transmitter and an antenna, comprising:
a transmission channel connected between the transmitter and the antenna, for forwarding a high-frequency current form the transmitter to the antenna, the high-frequency current being provided by the transmitter;
a plurality of threshold means connected in series in said transmission channel for establishing a connection between the transmitter and the antenna only when the high-frequency current flows in the transmission channel;
each of said threshold means having at least a PIN diode and a rectifier diode, said rectifier diode connected across the PIN diode in a reverse direction relative to the PIN diode, the rectifier diode generating a control current for the PIN diode from the high-frequency current flowing in the transmission channel;
at least one line section for interconnecting the plurality of threshold means to one another;
wherein the control current is generated only when the transmitter provides the high-frequency current and therefore each of the PIN diodes only being conductive when the high-frequency current flows in the transmission channel.

16. The transmission-reception separating filter according to claim 15, wherein the transmission channel has at least one capacitor, said capacitor preventing the control current from flowing to the transmitter.

17. The transmission-reception separating filter according to claim 15, wherein each rectifier diode has a carrier life span that is significantly shorter than a carrier life span of the respective PIN diode.

18. The transmission-reception separating filter according to claim 13 wherein in each threshold means an inductor is connected in series with the rectifier diode, whereby each series circuit of the rectifier diode and the inductor is connected in parallel to the respective PIN diode.

19. The transmission-reception separating filter according to claim 18, wherein each inductor is bridged with a respective attenuating resistor.

20. The transmission-reception separating filter according to claim 15, wherein the at least one short line section has a capacitance at a highest operating frequency of the high-frequency current that is significantly greater than a blocking capacitance of the PIN diodes.

21. The transmission-reception separating filter according to claim 15, wherein a last threshold means of the plurality of threshold means that is connected to the antenna is connected in the transmission channel in an opposite direction relative to the other threshold means in the transmission channel.

22. The transmission-reception separating filter according to claim 21, wherein the other threshold means have their respective PIN diodes connected in a forward direction relative to the high-frequency current flowing from the transmitter to the receiver, and wherein the last threshold means has its respective PIN diode connected in a reverse direction relative to the high-frequency current flowing from the transmitter to the receiver.

* * * * *